(12) United States Patent
Yamawaki et al.

(10) Patent No.: US 12,543,525 B2
(45) Date of Patent: Feb. 3, 2026

(54) SUBSTRATE PROCESSING APPARATUS AND SUBSTRATE PROCESSING METHOD

(71) Applicant: Tokyo Electron Limited, Tokyo (JP)

(72) Inventors: Yohei Yamawaki, Kumamoto (JP); Seiji Nakano, Kumamoto (JP); Tokutarou Hayashi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 572 days.

(21) Appl. No.: 17/996,507

(22) PCT Filed: Mar. 16, 2021

(86) PCT No.: PCT/JP2021/010662
§ 371 (c)(1),
(2) Date: Oct. 19, 2022

(87) PCT Pub. No.: WO2021/215145
PCT Pub. Date: Oct. 28, 2021

(65) Prior Publication Data
US 2023/0207344 A1    Jun. 29, 2023

(30) Foreign Application Priority Data

Apr. 20, 2020 (JP) ................................. 2020-074921

(51) Int. Cl.
*B32B 41/00* (2006.01)
*B23K 26/53* (2014.01)
(Continued)

(52) U.S. Cl.
CPC ........ *H01L 21/67092* (2013.01); *B23K 26/53* (2015.10); *H01L 21/304* (2013.01); *H01L 21/67259* (2013.01)

(58) Field of Classification Search
CPC ............. H01L 21/67092; H01L 21/304; H01L 21/67259; H01L 21/78; H01L 21/02; H01L 21/6838; H01L 21/68; B23K 26/53
(Continued)

(56) References Cited

U.S. PATENT DOCUMENTS

| 2014/0251546 A1* | 9/2014 | Deguchi | ............. B32B 38/1858 156/702 |
| 2016/0093518 A1 | 3/2016 | Jung | |
| 2021/0039203 A1 | 2/2021 | Hayato | |

FOREIGN PATENT DOCUMENTS

| JP | 2008-537316 A | 9/2008 |
| JP | 3225828 U | 4/2020 |

(Continued)

OTHER PUBLICATIONS

International Search Report of PCT/JP2021/010662 dated May 25, 2021.

*Primary Examiner* — Michael N Orlando
*Assistant Examiner* — Joshel Rivera
(74) *Attorney, Agent, or Firm* — Shih IP Law Group, PLLC.

(57) ABSTRACT

A substrate processing apparatus configured to process a combined substrate in which a first substrate and a second substrate are bonded to each other includes a holding member configured to hold the combined substrate; a removing member configured to separate at least a peripheral portion of the first substrate from the second substrate by being inserted between the first substrate and the second substrate; an elevating mechanism configured to adjust a relative height position of the removing member with respect to the holding member; and a controller configured to control an operation of the elevating mechanism. The controller controls the operation of the elevating mechanism such that the relative height position of the removing mem-
(Continued)

ber with respect to a target insertion position of the removing member is adjusted in an entire circumference of the combined substrate.

23 Claims, 12 Drawing Sheets

(51) Int. Cl.
*H01L 21/304* (2006.01)
*H01L 21/67* (2006.01)

(58) Field of Classification Search
USPC .................... 156/60, 64, 350, 351, 378, 379
See application file for complete search history.

(56) References Cited

FOREIGN PATENT DOCUMENTS

| KR | 10-2014-0021975 A | 2/2014 |
|----|-------------------|--------|
| KR | 10-2016-0126904 A | 11/2016 |
| WO | 2019176589 A1 | 9/2019 |

\* cited by examiner

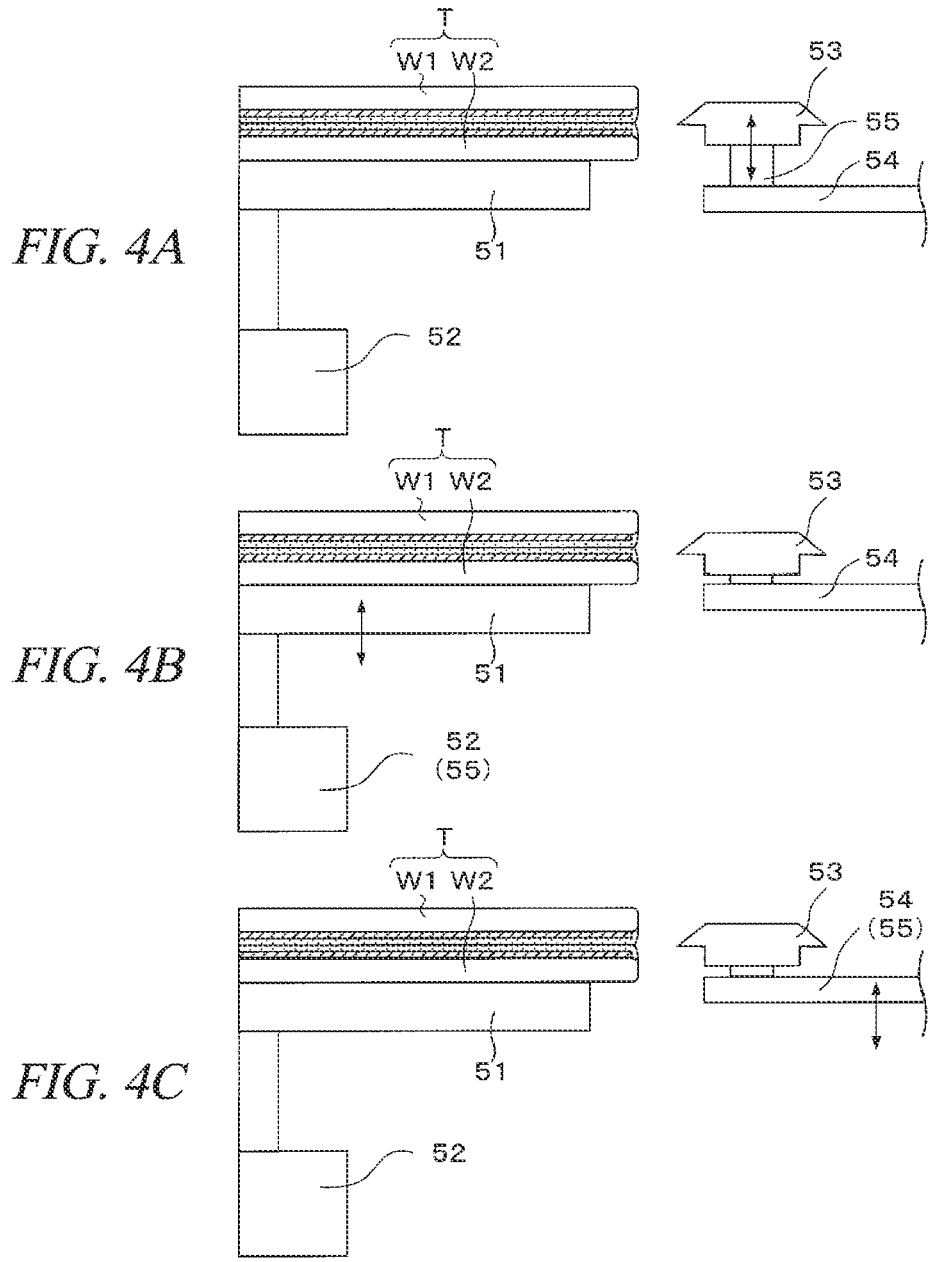

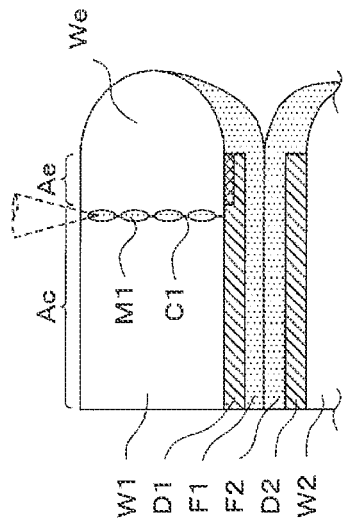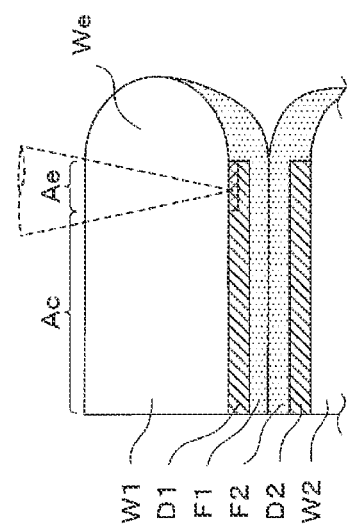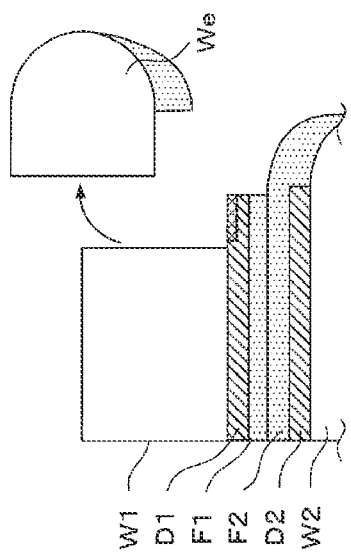

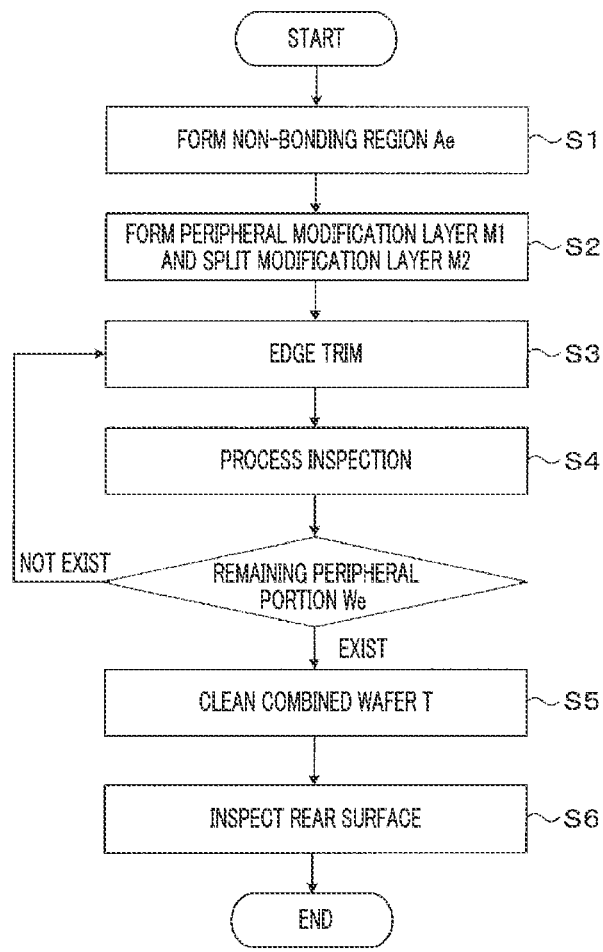

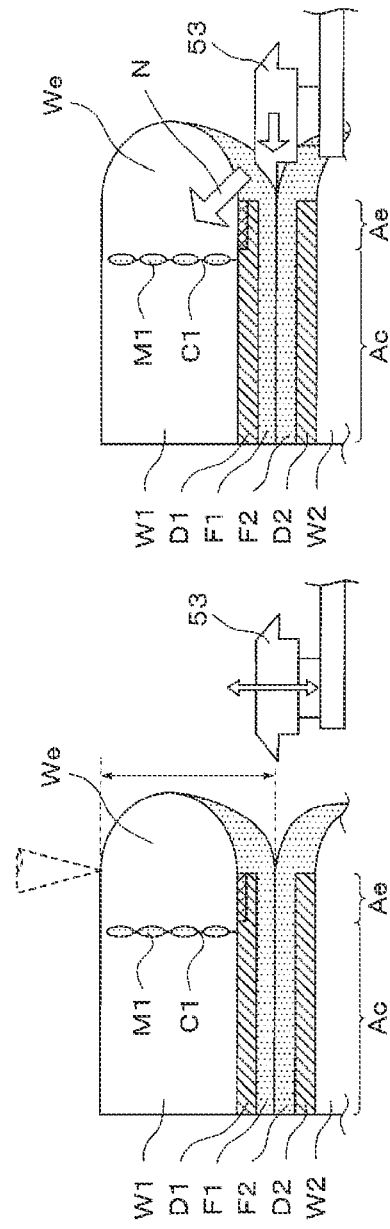
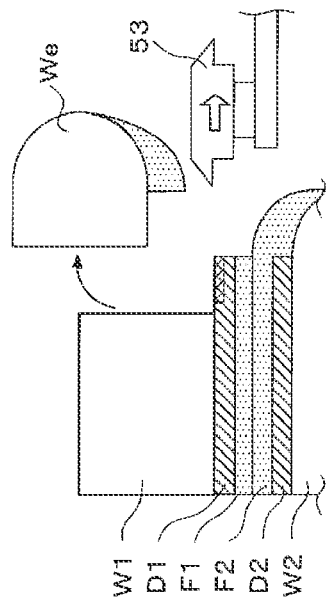
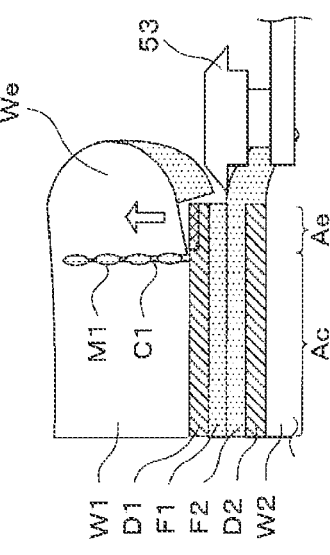

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2021/010662 filed on Mar. 16, 2021, which claims the benefit of Japanese Patent Application No. 2020-074921 filed on Apr. 20, 2020, the entire disclosures of which are incorporated herein by reference.

TECHNICAL FIELD

The various aspects and embodiments described herein pertain generally to a substrate processing apparatus and a substrate processing method.

BACKGROUND

Patent Document 1 discloses a substrate processing system for processing a substrate, including: a modification layer forming apparatus configured to form a modification layer inside a substrate along a boundary between a peripheral portion as a removing target and a central portion of the substrate; and a periphery removing apparatus configured to remove the peripheral portion starting from the modification layer.

PRIOR ART DOCUMENT

Patent Document 1: International Publication No. 2019/176589

DISCLOSURE OF THE INVENTION

Means for Solving the Problems

In an exemplary embodiment, an apparatus a substrate processing apparatus configured to process a combined substrate in which a first substrate and a second substrate are bonded to each other includes a holding member configured to hold the combined substrate; a removing member configured to separate at least a peripheral portion of the first substrate from the second substrate by being inserted between the first substrate and the second substrate; an elevating mechanism configured to adjust a relative height position of the removing member with respect to the holding member; and a controller configured to control an operation of the elevating mechanism. The controller controls the operation of the elevating mechanism such that the relative height position of the removing member with respect to a target insertion position of the removing member is adjusted in an entire circumference of the combined substrate.

BRIEF DESCRIPTION OF THE DRAWINGS

FIG. 4A to FIG. 4C are explanatory diagrams illustrating a configuration example of an elevating mechanism according to an exemplary embodiment.

FIG. 5A to FIG. 5C are explanatory diagrams schematically illustrating main processes of a wafer processing according to the exemplary embodiment.

FIG. 6 is a flowchart schematically illustrating the main processes of the wafer processing according to the exemplary embodiment.

FIG. 9A to FIG. 9D are explanatory diagrams schematically illustrating removal of a peripheral portion according to the exemplary embodiment.

DETAILED DESCRIPTION

Figure 1:
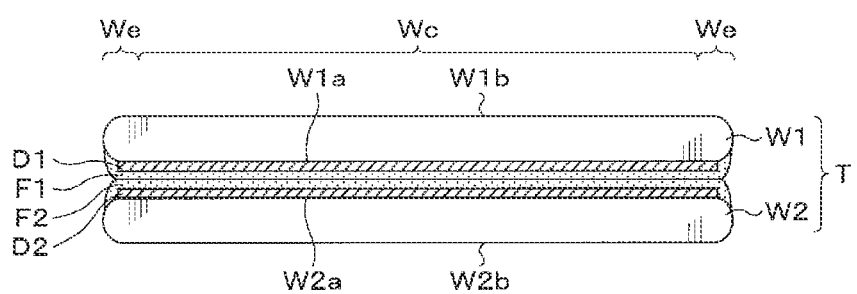
FIG. 1 is a side view illustrating an example of a combined wafer to be processed in a wafer processing system.

Recently, in a manufacturing process for a semiconductor device, in a combined wafer in which semiconductor substrates (hereinafter, referred to as "wafers") having a plurality of devices such as electronic circuits formed on front surface thereof are bonded to each other, a process of thinning the first wafer forming the combined wafer and a process of transcribing the device formed on the first wafer to the second wafer forming the combined wafer are performed.

In the wafer processing system disclosed in Patent Document 1 described above, as an example method of suppressing the formation of a knife edge shape on the first wafer (processing target wafer) by thinning process, removing of a peripheral portion of the first wafer before being subjected to the thinning process, that is, so-called edge trimming is performed. Specifically, in the combined wafer in which the first wafer and the second wafer (support wafer) are bonded to each other, a modification layer serving as a starting point for the removal of the peripheral portion is formed inside the first wafer, and, thereafter, the peripheral portion is separated from the first wafer starting from the modification layer.

The present inventors have examined a method of, in the edge trimming of the first wafer, separating the peripheral portion of the first wafer from the second wafer by inserting an insertion member (for example, a wedge roller or a blade) into an interface between the first wafer and the second wafer forming the combined wafer. However, when the insertion member is inserted into the interface in this way, the height position of the interface into which the insertion member is inserted may not be stable due to the influence of bending of the wafer or non-uniformity of the in-surface thickness of the wafer or a device layer, so that there is a risk that the peripheral portion of the first wafer may not be properly removed. In this regard, there is still a room for improvement in the conventional edge trimming method.

The technique according to the present disclosure enables to appropriately adjust an insertion position of a removing member with respect to a combined substrate in which a first substrate and a second substrate are bonded to each other. Hereinafter, a wafer processing system equipped with a periphery removing apparatus as a substrate processing apparatus according to an exemplary embodiment, and a wafer processing method as a substrate processing method will be described with reference to the accompanying drawings. In the present specification and the drawings, parts having substantially same functions and configurations will be assigned same reference numerals, and redundant description thereof will be omitted.

A wafer processing system 1 to be described later according to the present exemplary embodiment performs a required processing on a combined wafer T as a combined substrate in which a first wafer W1 as a first substrate and a second wafer W2 as a second substrate are bonded to each other, as illustrated in FIG. 1. In the wafer processing system 1, a peripheral portion We of the first wafer W1 is removed. Hereinafter, in the first wafer W1, a surface to be bonded to the second wafer W2 will be referred to as "front surface W1a," and a surface opposite to the front surface W1a will be referred to as "rear surface W1b." Likewise, in the second wafer W2, a surface to be bonded to the first wafer W1 will be referred to as "front surface W2a," and a surface opposite to the front surface W2a will be referred to as "rear surface W2b." Also, in the first wafer W1, a region on the diametrically inner side than the peripheral portion We to be removed by edge trimming will be referred to as a central portion Wc.

The first wafer W1 is a semiconductor wafer such as, but not limited to, a silicon substrate, and has, on the front surface W1a thereof, a device layer D1 including a plurality of devices. A surface film F1 to be bonded to the second wafer W2 is further formed on the device layer D1, and the device layer D1 is bonded to the second wafer W2 with the surface film F therebetween. The surface film F1 may be, by way of non-limiting example, an oxide film (a $SiO_2$ film or a TEOS film), a SiC film, a SiCN film, or an adhesive. Moreover, the peripheral portion We of the first wafer W1 is chamfered, and the thickness of the peripheral portion We decreases as it goes toward a leading end thereof on a cross section thereof. Here, the peripheral portion We is a portion to be removed in the edge trimming to be described later, and is in a range from, e.g., 0.5 mm to 3 mm from an edge of the first wafer W1 in a diametrical direction. Further, a laser absorption layer (not shown) capable of absorbing laser light radiated to the inside of the combined wafer T in the removal of the peripheral portion We may be further formed at an interface between the first wafer W1 and the device layer D1. Furthermore, the surface film F1 formed on the device layer D1 may be used as the laser absorption layer.

The second wafer W2 has the same structure as the first wafer W1, for example. A device layer D2 and a surface film F2 are formed on the front surface W2a, and a peripheral portion of the second wafer W2 is chamfered. Here, however, the second wafer W2 does not need to be a device wafer on which the device layer D2 is formed. By way of example, the second wafer W2 may be a support wafer that supports the first wafer W1. In this case, the second wafer W2 functions as a protection member for protecting the device layer D1 of the first wafer W1.

Figure 2:
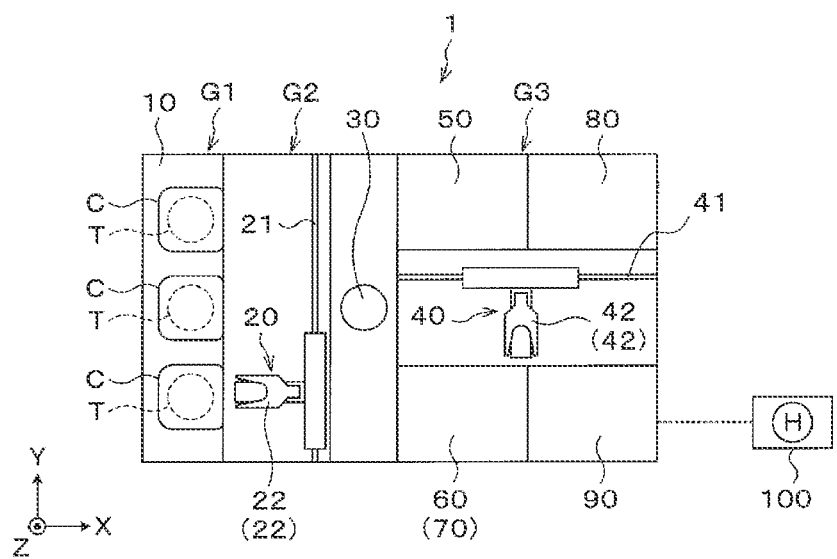
FIG. 2 is a plan view schematically illustrating a configuration of the wafer processing system.

As depicted in FIG. 2, the wafer processing system 1 includes a carry-in/out block G1, a transfer block G2, and a processing block G3 that are connected as one body. The carry-in/out block G1, the transfer block G2 and the processing block G3 are arranged in this sequence from the negative X-axis side.

In the carry-in/out block G1, a cassette C capable of accommodating therein a multiple number of combined wafers T is carried to/from the outside, for example. In the carry-in/out block G1, a cassette placing table 10 is provided. In the shown example, a plurality of, for example, three cassettes C can be arranged on the cassette placing table 10 in a row in the Y-axis direction. Further, the number of the cassettes C placed on the cassette placing table 10 is not limited to the example of the present exemplary embodiment but can be selected as required.

In the transfer block G2, a wafer transfer device 20 is provided adjacent to the cassette placing table 10 on the positive X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the example of the present exemplary embodiment, and various other configurations may be adopted. The wafer transfer device 20 is configured to be capable of transferring the combined wafer T to/from the cassette C of the cassette placing table 10 and a transition device 30 to be described later.

In the transfer block G2, the transition device 30 configured to deliver the combined wafer T is provided adjacent to the wafer transfer device 20 on the positive X-axis side of the wafer transfer device 20.

The processing block G3 is equipped with a wafer transfer device 40, a periphery removing apparatus 50, a cleaning apparatus 60, a rear surface inspecting apparatus 70, an internal modifying apparatus 80, and an interface modifying apparatus 90.

The wafer transfer device 40 is configured to be movable on a transfer path 41 which is elongated in the X-axis direction. Further, the wafer transfer device 40 is equipped with, for example, two transfer arms 42 each of which is configured to hold and transfer the combined wafer T. Each transfer arm 42 is configured to be movable in a horizontal direction and a vertical direction and pivotable around a horizontal axis and a vertical axis. Further, the configuration of the transfer arm 42 is not limited to the example of the present exemplary embodiment, and various other configurations may be adopted. The wafer transfer device 40 is configured to be capable of transferring the combined wafer T to/from the transition device 30, the periphery removing apparatus 50, the cleaning apparatus 60, the rear surface inspecting apparatus 70, the internal modifying apparatus 80, and the interface modifying apparatus 80.

The periphery removing apparatus 50 removes the peripheral portion We of the first wafer W1, that is, performs edge trimming. Details of the periphery removing apparatus 50 will be described later. The cleaning apparatus 60 cleans the combined wafer T. The rear surface inspecting apparatus 70 is stacked on the cleaning apparatus 60, for example, and inspects a rear surface of the combined wafer T after being subjected to the edge trimming. The internal modifying apparatus 80 radiates laser light (laser light for inside, for example, a YAG laser) to the inside of the first wafer W1 to form a peripheral modification layer M1 serving as a starting point for separating of the peripheral portion We and a split modification layer M2 serving as a starting point for breaking the peripheral portion We into smaller pieces. The interface modifying apparatus 90 radiates laser light (laser light for interface, for example, a $CO_2$ laser) to an interface between the first wafer W1 and the second wafer W2 serving as a starting point for the separating of the peripheral portion We to form a non-bonding region Ae to be described later.

The above-described wafer processing system 1 is equipped with a control device 100 as a controller. The control device 100 is implemented by, for example, a computer, and includes a program storage (not shown). A program for controlling the processing of the combined wafer T in the wafer processing system 1 is stored in the program storage. Further, the program storage also stores therein a program for implementing a wafer processing to be described later in the wafer processing system 1 by controlling the above-described various processing apparatuses and a driving system such as the transfer devices. Further, the programs may be recorded in a computer-readable recording medium H, and may be installed from this recording medium H to the control device 100.

The wafer processing system 1 according to the present exemplary embodiment is configured as described above. Now, the aforementioned periphery removing apparatus 50 as the substrate processing apparatus will be explained.

Figure 3:
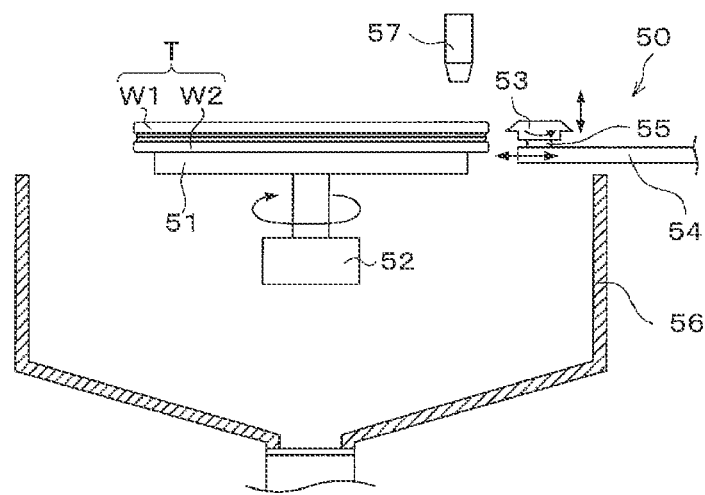
FIG. 3 is a side view illustrating a schematic configuration of a periphery removing apparatus according to an exemplary embodiment.

As depicted in FIG. 3, the periphery removing apparatus 50 has a chuck 51 as a holding member configured to hold the combined wafer T on a top surface thereof. The chuck 51 holds the rear surface W2b of the second wafer W2 in the state in which the first wafer W1 is placed on the upper side and the second wafer W2 is placed on the lower side. In addition, the chuck 51 is configured to be rotatable around a vertical axis by a rotating mechanism 52, and is configured to be capable of adjusting a relative position of an insertion member 53 to be described later in a circumferential direction with respect to the combined wafer T held on the chuck 51.

At a side of the chuck 51, there is provided an insertion member 53 as a removing member configured to remove the peripheral portion We of the first wafer W1 by being inserted into the interface between the first wafer W1 and the second wafer W2. As shown in FIG. 3, the insertion member 53 has a shape with a pointed end (for example, a wedge roller, a blade, etc.) when viewed from the side, and is configured to be rotatable around a vertical axis by a non-illustrated rotating mechanism. Further, the insertion member 53 is configured to be moved by a horizontally moving mechanism 54 in a forward/backward direction with respect to the combined wafer T held by the chuck 51. Further, as shown in FIG. 4A, a relative height position of the insertion member 53 with respect to the combined wafer T held by the chuck 51 is adjustable by an elevating mechanism 55.

In the periphery removing apparatus 50, the insertion member 53 is moved horizontally by the horizontally moving mechanism 54 to be inserted into a target position, that is, the interface between the front surface W1a of the first wafer W1 and the front surface W2a of the second wafer W2. Accordingly, the peripheral portion We is pushed up from the second wafer W2. Then, by rotating the chuck 51 in the state that the insertion member 53 is inserted into the interface, the peripheral portion We is separated and removed from the first wafer W1 (combined wafer T) (hereinafter, an actual height position at which the peripheral portion We is separated from the second wafer W2 will sometimes be referred to as "separation interface").

Further, a cup body 56 is provided at a side of the chuck 51 so as to surround the chuck 51. A collecting mechanism (not shown) for the peripheral portion We is connected to a lower portion of the cup body 56. The peripheral portion We of the first wafer W1 removed from the first wafer W1 as a result of the insertion of the insertion member 53 is received by the cup body 56 and is discharged to the collecting mechanism.

Disposed above the chuck 51 is a height detecting mechanism 57 configured to detect height positions of the combined wafer T held by the chuck 51 and the insertion member 53. A non-contact type laser displacement meter may be used an example of the height detecting mechanism 57. The height detecting mechanism 57 detects the height position of the combined wafer T held by the chuck 51 by radiating laser light to the peripheral portion We from the rear surface W1b side of the first wafer W1, for example. The detected height position of the combined wafer T is outputted to the control device 100. In the periphery removing apparatus 50, the relative height position of the insertion member 53 with respect to the combined wafer T is adjusted based on the detected height position of the combined wafer T and the previously acquired height position of the insertion member 53. That is, the height position of the insertion member 53 is adjusted by the elevating mechanism 55 based on the detected height position of the combined wafer T so that the insertion member 53 is located at the target position, that is, between the first wafer W1 and the second wafer W2. By way of example, the height position of the insertion member 53 may be detected by moving the insertion member 53 to below the height detecting mechanism 57 by the horizontally moving mechanism 54. As another example, the height detecting mechanism 57 may be moved by a moving mechanism (not shown) to be located above the insertion member 53.

Further, the height detecting mechanism 57 may detect whether the peripheral portion We has been properly removed from the first wafer W1 by radiating laser light to the combined wafer T after being subjected to the edge trimming. Specifically, by detecting a height position at a position corresponding to the peripheral portion We of the first wafer W1 after being subjected to the edge trimming and comparing the detected height position with the height position of the peripheral portion We of the first wafer W1 before being subjected to the edge trimming, presence or absence of the peripheral portion We after the edge trimming can be detected. That is, the height detecting mechanism 57 may operate as "separation inspecting mechanism" according to the technique of the present disclosure.

Furthermore, the presence or absence of the peripheral portion We after the edge trimming may be inspected by using, instead of the height detecting mechanism 57, a separation inspecting mechanism (not shown) configured to inspect the presence or absence of the peripheral portion We after the edge trimming. By way of example, the separation inspecting mechanism may inspect the presence or absence of the peripheral portion We by detecting the height position of the combined wafer T, the same as the height detecting mechanism 57, or by imaging the first wafer W1 after being subjected to the edge trimming through the use of an imaging device (for example, a CCD camera or the like).

Although the periphery removing apparatus 50 according to the example of the present exemplary embodiment is configured as described above, the configuration of the periphery removing apparatus 50 is not limited thereto.

For example, in the above-described exemplary embodiment, the relative position of the chuck 51 and the insertion member 53 in the circumferential direction is adjusted by rotating the chuck 51 with the rotating mechanism 52. However, instead of or in addition to the rotating mechanism 52, the insertion member 53 may be configured to be movable along the circumferential direction of the combined wafer T.

For example, the periphery removing apparatus 50 may be further equipped with a member inspecting mechanism (not shown) configured to inspect the state of the edge of the blade of the insertion member 53, specifically, configured to inspect presence or absence of a damage of the insertion member 53, the position of the damage, etc. As such a member inspecting mechanism, a CCD camera, a CMOS camera, or the like may be used, for example.

For example, in the above-described exemplary embodiment, the relative height position of the insertion member 53 with respect to the target position is adjusted by moving the insertion member 53 up and down by the elevating mechanism 55 as shown to FIG. 4A. However, how to adjust the height position of the insertion member 53 is not limited thereto. By way of example, the chuck 51 may be configured to be movable up and down by an elevating mechanism, as shown in FIG. 4B, or the horizontally moving mechanism 54 may be configured to be movable up and down, and the insertion member 53 may be configured to be movable up and down as one body with the horizontally moving mechanism 54, as illustrated in FIG. 4C.

For example, in the above-described exemplary embodiment, the height position of the combined wafer T is detected by radiating the laser light from the height detecting mechanism 57 to the peripheral portion We from the rear surface W1$b$ side. However, the height position of the combined wafer T may be detected by radiating laser light to the vicinity of the peripheral portion We at the central portion We of the first wafer W1. As still another example, laser light may be radiated from the rear surface W2$b$ side of the second wafer W2 by the height detecting mechanism 57. That is, the height position of the insertion member 53 may be adjusted by the elevating mechanism 55 based on the rear surface W2$b$ of the second wafer W2.

For example, in the above-described exemplary embodiment, although the non-contact type laser displacement meter is used as the height detecting mechanism 57, the same as the separation inspecting mechanism mentioned above, an imaging device (for example, a CCD camera, a CMOS camera, etc.) may be used as the height inspecting mechanism 57. That is, the combined wafer T held by the chuck 51 may be imaged, and the height position of the insertion member 53 may be adjusted based on the obtained image.

Now, the wafer processing performed by using the wafer processing system 1 configured as described above and the periphery removing apparatus 50 will be explained. In the present exemplary embodiment, the first wafer W1 and the second wafer W2 are bonded to form the combined wafer T in advance in a bonding apparatus (not shown) provided outside the wafer processing system 1.

First, the cassette C accommodating therein a plurality of combined wafers T is placed on the cassette placing table 10 of the carry-in/out block G1. Then, the combined wafer T in the cassette C is taken out by the wafer transfer device 20. The combined wafer T taken out from the cassette C is delivered to the wafer transfer device 40 via the transition device 30, and then transferred to the interface modifying apparatus 90. In the interface modifying apparatus 90, by radiating laser light (for example, a $CO_2$ laser having a wavelength of 8.9 μm to 11 μm) to the interface between the first wafer W1 and the device layer D1 (more specifically, the aforementioned laser absorption layer formed at the interface) while rotating the combined wafer T (the first wafer W1), the non-bonding region Ae is formed (process S1 of FIG. 6), as illustrated in FIG. 5A.

In the non-bonding region Ae, the interface between the first wafer W1 and the device layer D1 is modified or separated, so the bonding strength between the first wafer W1 and the second wafer W2 is reduced or eliminated. As a result, at the interface between the first wafer W1 and the device layer D1, the non-bonding region Ae having an annular shape is formed, and, also, a bonding region Ac in which the first wafer W1 and the second wafer W2 are bonded is formed on the diametrically inner side than the non-bonding region Ae. In the edge trimming to be described later, the peripheral portion We of the first wafer W1 as a removing target is removed. At this time, since the non-bonding region Ae is present as described above, the peripheral portion We can be removed appropriately.

Figure 7:
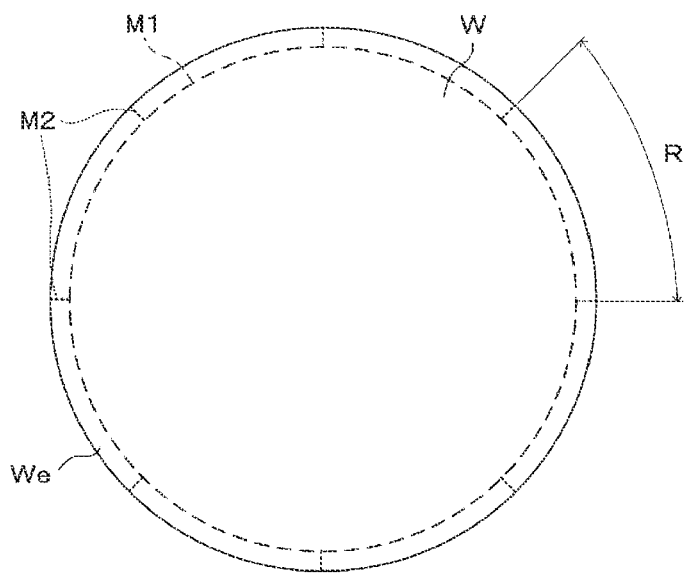
FIG. 7 is an explanatory diagram illustrating an example of formation of a modification layer in a first wafer.

The combined wafer T having the non-bonding region Ae formed therein is then transferred to the internal modifying apparatus 80 by the wafer transfer device 40. In the internal modifying apparatus 80, the peripheral modification layer M1 and the split modification layer M2 are formed inside the first wafer W1, as shown in FIG. 5B and FIG. 7 (process S2 of FIG. 6). The peripheral modification layer M1 serves as a starting point when the peripheral portion We is removed in the edge trimming to be described later. The split modification layer M2 serves as a starting point for breaking the peripheral portion We to be removed into smaller pieces. In the drawings to be referred to in the following description, illustration of the split modification layer M2 may be omitted for the simplicity of illustration.

Here, the formation position of the peripheral modification layer M1 is decided to be slightly inside, in the diametrical direction, the inner edge of the non-bonding region Ae formed in the process S1. Although it is ideal that the peripheral modification layer M1 is formed at a position overlapping a boundary between the bonding region Ac and the non-bonding region Ae (hereinafter, simply referred to as "the boundary"), the peripheral modification layer M1 may be actually formed while being deviated from the boundary in the diametrical direction due to, for example, a processing error or the like. If the peripheral modification layer M1 is thus formed at a position apart from the boundary in the diametrically outward direction, that is, in the non-bonding region Ae, the first wafer W1 may not be firmly bonded to the second wafer W2 after the edge trimming. However, by controlling the peripheral modification layer M1 to be formed diametrically inside the boundary, even if the formation position of the peripheral modification layer M1 is deviated, the peripheral modification layer M1 can still be formed at the position overlapping the boundary or at a position adjacent to the boundary even if it is diametrically outside the boundary. Thus, formation of the peripheral modification layer M1 at a position apart from the boundary in the diametrically outward direction may be suppressed.

Further, from the peripheral modification layer M1, a crack C1 develops within the first wafer W1 in a thickness direction thereof, as shown in FIG. 5B. Likewise, from the split modification layer M2, a crack C2 (not shown) develops within the first wafer W1 in the thickness direction thereof.

The combined wafer T having the peripheral modification layer M1 and the split modification layer M2 formed inside the first wafer W1 is then transferred by the wafer transfer device 40 to the periphery removing apparatus 50. In the periphery removing apparatus 50, removing of the peripheral portion We of the first wafer W1, that is, the edge trimming is performed as shown in FIG. 5C (process S3 of FIG. 6). At this time, the peripheral portion We is separated from the central portion Wc of the first wafer W1 starting from the peripheral modification layer M1 and the crack C1, and also separated from the device layer D1 (second wafer W2) starting from the non-bonding region Ae. At this time, the peripheral portion We being removed is broken into smaller pieces starting from the split modification layer M2 and the crack C2.

The edge trimming performed in the periphery removing apparatus 50 will be described in detail.

Figure 8:
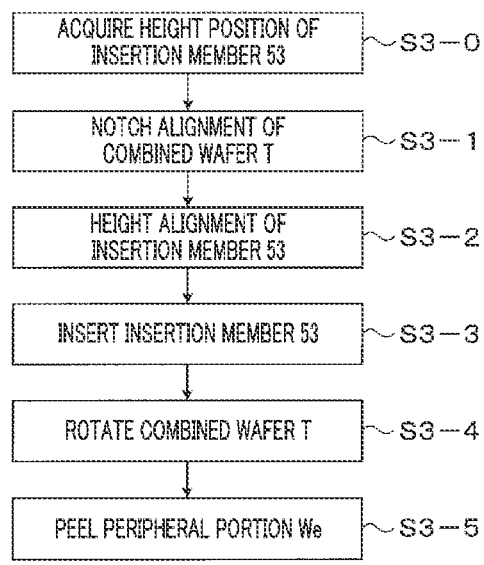
FIG. 8 is a flowchart schematically illustrating main processes of periphery removal according to the exemplary embodiment.

In the edge trimming of the peripheral portion We of the first wafer W1, the height position of the insertion member 53 within the periphery removing apparatus 50 is acquired prior to the carry-in of the combined wafer T into the periphery removing apparatus 50 (process S3-0 of FIG. 8). Specifically, by moving the insertion member 53 to below the height detecting mechanism 57 by the horizontally moving mechanism 54 and radiating the laser light to the insertion member 53, the height position of the insertion member 53 is detected. This height position of the insertion member 53 may be detected and acquired by the height detecting mechanism 57 for each processing of the combined wafer T in the periphery removing apparatus 50, and may be acquired by referring to a height position of the insertion member 53 stored in the control device 100 in advance.

For the combined wafer T carried into the periphery removing apparatus 50, the direction of the combined wafer T in the horizontal direction is first adjusted (notch alignment) (process S3-1 of FIG. 8). In the notch alignment, the position of a notch (not shown) formed at the peripheral portion We of the first wafer W1 is detected while rotating the combined wafer T held by the chuck 51 with the rotating mechanism 52, and the position of the notch is adjusted.

Then, the height position of the insertion member 53 to be inserted into the interface of the combined wafer T is adjusted (height alignment) (process S3-2 of FIG. 8). In the height alignment, the top surface of the combined wafer T held by the chuck 51 (the rear surface W1b of the first wafer W1) is detected by using the height detecting mechanism 57, as illustrated in FIG. 9A. Thereafter, the height position of the insertion member 53 is adjusted by the elevating mechanism 55 based on the detected height position of the top surface of the combined wafer T and the height position of the insertion member 53 obtained in the process S3-0. At this time, the height position of the insertion member 53 is set to a predetermined position between the first wafer W1 and the second wafer W2, which is the target position to which the insertion member 53 is to be inserted.

Here, when the combined wafer T is bent as described above, or when the in-surface thickness of the combined wafer or the device layer is not uniform, there is a likelihood that the target position to which the insertion member 53 is to be inserted in the removal of the peripheral portion We may not be stable in the circumferential direction of the combined wafer T. If the target position is not stable in this way, when rotating the combined wafer T while inserting the insertion member 53 as will be described later, there may be caused an error in the target position with respect to an insertion height position of the insertion member 53, resulting in a failure to properly separate the peripheral portion We.

Therefore, in the height alignment according to the present exemplary embodiment, by radiating the laser light to the peripheral portion We while rotating the combined wafer T held by the chuck 51 with the rotating mechanism 52, the height position is detected along the entire circumference of the combined wafer T. When rotating the combined wafer T to remove the peripheral portion We as will be described later, the height position of the insertion member 53 is adjusted based on the height position of the combined wafer T detected in this way and the relative position of the insertion member 53 with respect to the combined wafer T in the circumferential direction.

Upon the completion of the height alignment of the insertion member 53, the insertion member 53 is then inserted to the target position by using the horizontally moving mechanism 54, as illustrated in FIG. 9B (process S3-3 of FIG. 8). To elaborate, the insertion member 53 is inserted to the insertion height position determined in the process S3-2, that is, the predetermined position between the first wafer W1 and the second wafer W2. If the insertion member 53 is inserted between the first wafer W1 and the second wafer W2, a stress N acts in a direction in which the peripheral portion We of the first wafer W1 is separated from the second wafer W2, as shown in FIG. 9B, and, afterwards, the peripheral portion We is separated starting from the peripheral modification layer M1 and the crack C1, as illustrated in FIG. 9C. At this time, since the insertion member 53 has, for example, a wedge shape, when the leading end of the insertion member 53 is inserted between the first wafer W1 and the second wafer W2, the stress N can be appropriately applied to the peripheral portion We by the insertion member 53. In addition, at this time, the non-bonding region Ae is formed at the interface between the first wafer W1 and the device layer D1, whereby the bonding strength between the first wafer W1 and the second wafer W2 is reduced or eliminated. Accordingly, if the stress N is applied by the insertion of the insertion member 53, the peripheral portion We is separated from the second wafer W2 starting from the non-bonding region Ae in which the bonding strength is reduced.

In this way, if the insertion member 53 can be inserted between the first wafer W1 and the second wafer W2 to thereby apply the stress N to the peripheral portion We as shown in FIG. 9B, the peripheral portion We can be separated from the second wafer W2 starting from the non-bonding region Ae. In other words, in the removal of the peripheral portion We, even if the insertion height of the insertion member 53 with respect to the combined wafer T does not necessarily coincide with the formation height of the non-bonding region Ae which is to become the separation interface, the peripheral portion We can be appropriately removed from the second wafer W2. When the insertion height of the insertion member 53 and the height position of the separation interface of the peripheral portion We are different in this way, the insertion member 53 is suppressed from colliding with the combined wafer T, so that the peripheral portion We can be safely removed. Additionally, it is desirable that the insertion height of the insertion member 53 with respect to the combined wafer T is on a level with an interface between the surface film F1 and the surface film F2, which are the bonding surfaces of the first wafer W1 and the second wafer W2. It is because, as shown in FIG. 9B, if a space as a non-bonding surface is formed at the interface between the surface film F1 and the surface film F2, which are the bonding surfaces of the first wafer W1 and the second wafer W2, the insertion member 53 may be easily inserted into the space. Therefore, the stress N can be made to act on the separation interface efficiently.

Figure 10A:
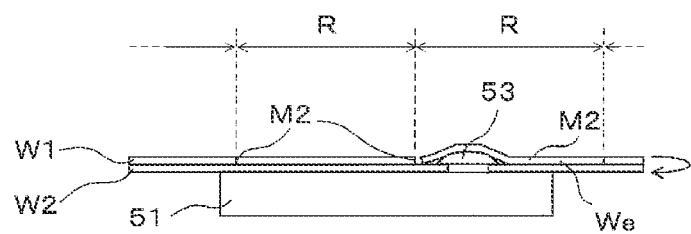
FIG. 10A to FIG. 10C are explanatory diagrams schematically illustrating the removal of the peripheral portion according to the exemplary embodiment.

Further, it is desirable that the insertion position of the insertion member 53 with respect to the circumferential direction of the combined wafer T is decided to avoid a region (hereinafter, sometimes referred to as "division region R") between one split modification layer M2 and another adjacent split modification layer M2 shown in FIG. 7, that is, the formation position of the split modification layer M2. At this time, it is more desirable that the insertion position of the insertion member 53 is on the upstream side of the division region R (the vicinity of the aforementioned one split modification layer M2) in terms of the rotation of the combined wafer T, as illustrated in FIG. 10A. By inserting the insertion member 53 to the upstream side of the division region R in this way, the one split modification layer M2 is fractured by receiving a tensile force caused by the separating of the peripheral portion We.

Figure 10B:
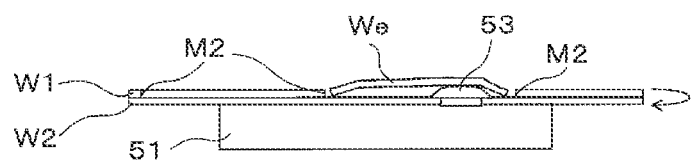
Figure 10C:
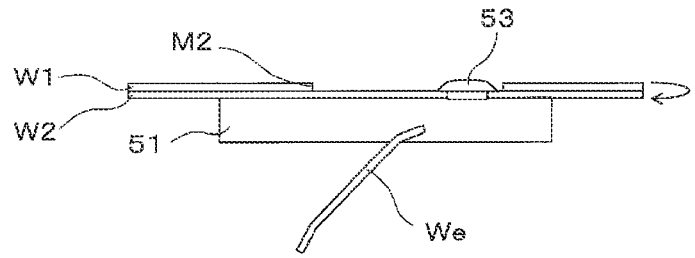

After the insertion member 53 is inserted into the combined wafer T, the combined wafer T held by the chuck 51 is then rotated by the rotating mechanism 52, whereby the separating of the peripheral portion We proceeds in the circumferential direction (rotational direction of the combined wafer T) (process S3-4 of FIG. 8). At this time, the insertion member 53 is also rotated around the vertical axis, following the rotation of the combined wafer T. Thereafter, if the insertion member 53 reaches the other end side of the division region R (the vicinity of the aforementioned another split modification layer M2) as illustrated in FIG. 10B, this split modification layer M2 is fractured by receiving the tensile force caused by the separating of the peripheral portion We, so that the peripheral portion We is broken into smaller pieces. If the peripheral portion We is separated and broken into smaller pieces along the entire length of the division region R in this way, the peripheral portion We in the corresponding division region R is removed from the first wafer W1 (combined wafer T), as depicted in FIG. 9D and FIG. 10C (process S3-5 of FIG. 8). The removed peripheral portion We falls into the cup body 56 due to its own weight, and is then collected by the non-illustrated collecting mechanism.

Once the peripheral portion We in the one division region R is removed, the removal of the peripheral portion We is then performed in the next adjacent division region R. At this time, if the rotation of the combined wafer T is carried on after the removal of the peripheral portion We in the one division region R, the insertion member 53 may collide with one end of the peripheral portion We in the next division region R, and a reaction force in the opposite direction to the rotational direction of the combined wafer T may be applied. In such a case, there is a risk that the peripheral portion We may not be properly removed.

In view of this, in the removal of the peripheral portion We in the next division region R, it is desirable to retreat the insertion member 53 by the horizontally moving mechanism 54 before starting the separating of the peripheral portion We and to perform the insertion of the insertion member 53 again on the upstream side of the division region R avoiding the split modification layer M2. Thus, the fragmentation and the removal of the peripheral portion We can be carried out more appropriately.

In addition, as described above, when the height position between the first wafer W1 and the second wafer W2, which is the target position, is not stable in the circumferential direction of the combined wafer T, an error may occur between the insertion height position and target position of the insertion member 53 when the combined wafer T is rotated, raising a risk that the peripheral portion We may not be appropriately removed. To solve the problem, in the present exemplary embodiment, the height position of the insertion member 53 is adjusted according to the position of the combined wafer T in the circumferential direction based on the height position in the entire circumference of the combined wafer T detected in the process S3-2. In other words, based on the detected height position in the entire circumference of the combined wafer T, the insertion height of the insertion member 53 in the entire circumference of the combined wafer T is calculated, and the height of the insertion member 53 is adjusted to the calculated insertion height by the elevating mechanism 55. Therefore, the peripheral portion We can be appropriately separated along the entire circumference of the combined wafer T.

After the peripheral portion We is removed along the entire circumference of the combined wafer T, a process inspection for checking the removed state of the peripheral portion We is performed (process S4 of FIG. 6). Specifically, by detecting a height position at a position corresponding to the peripheral portion We after the edge trimming by using the height detecting mechanism 57 and, then, by comparing the detected height position information with the height position information of the peripheral portion We before the edge trimming, it can be checked whether or not the peripheral portion We has been properly removed. Further, this process inspection may be carried out by imaging the position corresponding to the peripheral portion We after the edge trimming, using the imaging device as the height detecting mechanism 57 as stated above.

In addition, in parallel with the process inspection, presence or absence of a damage of the insertion member 53, the position of the damage, and so forth may be inspected by using the aforementioned member inspecting mechanism (not shown). Moreover, the above-described process inspection may be performed by using this member inspecting mechanism.

If it is determined in the process inspection that the edge trimming has not been properly performed, a position where the edge trimming is not properly performed, that is, a position of the combined wafer T in the circumferential direction where the peripheral portion We remains, the size of the remaining peripheral portion We, and the like are detected. Then, after relatively moving the insertion member 53 to the position of the combined wafer T in the circumferential direction where the peripheral portion We remains, the remaining peripheral portion We is removed by inserting the insertion member 53 again (process S3 of FIG. 6), and the process inspection (process S4 of FIG. 6) is performed after this removing processing is performed again.

In addition, in the removing processing of the peripheral portion We that is performed again after the process inspection, the insertion height of the insertion member 53 with respect to the combined wafer T may be determined based on the height position detected at the time of the process inspection of process S4, or may be determined based on the height position detected at the time of the height alignment of process S3-2.

The combined wafer T that is found in the process inspection to be properly edge-trimmed is then transferred to the cleaning apparatus 60 by the wafer transfer device 40. In the cleaning apparatus 60, the combined wafer T with its peripheral portion We removed is cleaned (process S5 of FIG. 6).

Next, the combined wafer T is transferred to the rear surface inspecting apparatus 70 by the wafer transfer device 40. In the rear surface inspecting apparatus 70, adhesion of particles to the rear surface of the combined wafer T with its peripheral portion We removed, that is, the rear surface W2b of the second wafer W2 is inspected (process S6 of FIG. 6). Furthermore, in the rear surface inspecting apparatus 70, the rear surface W1b of the first wafer W1 as well as the rear surface W2b of the second wafer W2 may be further inspected.

Thereafter, the combined wafer T after being subjected to all the required processes of the wafer processing is transferred to the cassette C of the cassette placing table 10 by the wafer transfer device 20 via the transition device 30. In this way, the series of processes of the wafer processing in the wafer processing system 1 are completed.

According to the above-described exemplary embodiment, even when the target position into which the insertion member 53 is to be inserted is not stable, the insertion height position of the insertion member 53 can be appropriately adjusted as the insertion member 53 is configured to be movable up and down by the elevating mechanism 55. Further, in the above-described exemplary embodiment, in order to detect, along the entire circumference of the combined wafer T, the height position between the first wafer W1 and the second wafer W2, which is the target position for inserting the insertion member 53, the insertion member 53 can be appropriately moved up and down, keeping up with a change in the target position. That is, according to the present exemplary embodiment, the peripheral portion We can be appropriately removed from the first wafer W1.

In addition, in the above-described exemplary embodiment, after performing the detection of the height position in the entire circumference of the combined wafer T in the height alignment, the insertion member 53 is inserted, and the removal of the peripheral portion We is performed while adjusting the height position of the insertion member 53 in the rotation of the combined wafer T. However, the timing for the detection of the height position of the combined wafer T in the edge trimming of the peripheral portion We (process S3 of FIG. 6) and the calculation of the insertion height of the insertion member 53 (hereinafter referred to as "height position detection, etc.") may not be limited thereto. By way of example, the height position detection, etc. of the combined wafer T may be performed by the height detecting mechanism 57 on the upstream of the insertion position of the insertion member 53 in the rotational direction of the combined wafer T, and the insertion of the insertion member 53 and the adjustment of the height position thereof may be performed on the downstream of the height detecting mechanism 57 based on the detected height position information. That is, the height position detection, etc. of the combined wafer T and the insertion of the insertion member 53 and the adjustment of the height position thereof may be performed at the same time.

Further, in the above-described exemplary embodiment, after performing the height position detection, etc. in the entire circumference of the combined wafer T in the height alignment, the peripheral portion We is removed by adjusting the height position of the insertion member 53 based on the detected height position information. However, this height alignment and the removal of the peripheral portion We may be performed for each division region. That is, in the edge trimming of the process S3, for example, the height position detection, etc. of the combined wafer T in one division region and the removal of the peripheral portion We in the one division region may be repeatedly performed in the entire circumference of the combined wafer T. Furthermore, at this time, when the peripheral portion We in the one division region is being removed, the height position detection, etc. of the combined wafer T in the next division region may be performed in parallel.

Furthermore, in the above-described exemplary embodiment, after performing the height position detection, etc. of the combined wafer T, the height position of the insertion member 53 inserted into the combined wafer T is adjusted on the downstream of the height detecting mechanism 57 in the rotational direction of the combined wafer T, or in a process after the height position detection, etc., for example. However, the height position detection, etc. and the adjustment of the height position may be performed simultaneously in parallel. That is, the height position of the insertion member 53 may be adjusted in real time based on the height position information acquired by the height position detection, etc.

In this way, when removing the peripheral portion We by adjusting the height position of the insertion member 53 in real time, the method of adjusting the height position of the combined wafer T is not limited to the method based on the height position detected by the laser displacement meter, and a guide member may be brought into physical contact with the combined wafer T.

Figure 11:
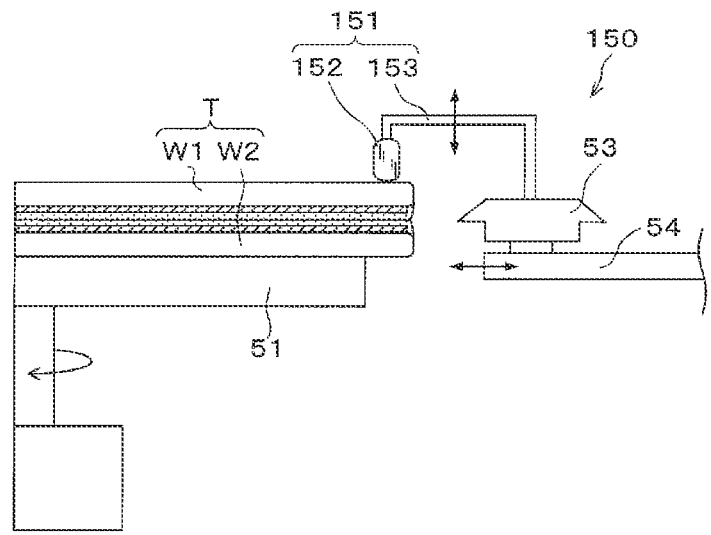
FIG. 11 is a side view schematically illustrating another configuration of the periphery removing apparatus according to the exemplary embodiment.

To elaborate, as illustrated in FIG. 11, the periphery removing apparatus 150 according to a second exemplary embodiment includes a guide member 151 instead of the height detecting mechanism 57. The guide member 151 includes a contact member 152 (for example, a roller) configured to travel in contact with the top surface of the combined wafer T, that is, the rear surface W1b of the first wafer W1; and an arm member 153 connecting the contact member 152 and the insertion member 53 as one body. In addition, the relative height positional relationship between the contact member 152 and the insertion member 53 is set such that a distance therebetween is equal to a previously acquired distance from the rear surface W1b of the first wafer W1 to the target position to which the insertion member 53 is to be inserted. In the present exemplary embodiment, the insertion member 53 is moved up and down as one body with the contact member 152 via the arm member 153 when the contact member 152 is moved up and down. Furthermore, the insertion member 53 is configured to be moved in a horizontal direction by the horizontally moving mechanism 54, independently of the contact member 152 and the arm member 153.

In the edge trimming in the periphery removing apparatus 150, the contact member 152 is brought into contact with the top surface of the combined wafer T held by the chuck 51, that is, the rear surface W1b of the first wafer W1. If the combined wafer T held by the chuck 51 is rotated in this state, the contact member 152 is moved up and down, following a change in the height position of the top surface of the combined wafer T. Here, since the insertion member 53 is connected as one body with the contact member 152 by the arm member 153, the insertion member 53 is moved up and down, following a change in the height position of the contact member 152, that is, a change in the height position of the top surface of the combined wafer T. Further, as stated above, since the relative height positions of the contact member 152 and the insertion member 53 are set so that the height position of the insertion member 53 coincides with the target position, the insertion member 53 is moved up and down according to the change in the target position of the insertion member 53.

Therefore, by inserting the insertion member 53 into the combined wafer T in the state that the contact member 152 is brought into contact with the top surface of the combined wafer T, the insertion height position of the insertion member 53 can be appropriately adjusted even when the height position between the first wafer W1 and the second wafer W1, which is the target position, is not stable.

Further, in the edge trimming in the above-described exemplary embodiment, although the height position of the insertion member 53 is adjusted with respect to the target position calculated based on the height position of the combined wafer T, the height position of the insertion member 53 inserted into the combined wafer T may be fixed. That is, for example, when the target position calculated in the height alignment is stable in the entire circumference, or, even if not stable, when the non-uniformity falls within an allowable threshold, the peripheral portion We can be appropriately removed even when the height position of the insertion member 53 is fixed. In addition, the non-uniformity of the target position with respect to the threshold value can be calculated based on an average value, a median value, a maximum value or a minimum value of the detected height position information in the entire circumference of the combined wafer T. By fixing the height position of the insertion member 53 in the edge trimming in this way, a control in the edge trimming becomes easy, so that a burden on the devices can be reduced.

Additionally, at this time, the insertion height position of the insertion member 53 with respect to the combined wafer T may be decided for each division region R of the peripheral portion We. Further, the non-uniformity of the target position with respect to the threshold value based on the average value, the median value, the maximum value, or the minimum value of the height position information may be calculated for each division region R of the peripheral portion We, and it may also be determined for each division region R whether the height position of the insertion member 53 will be fixed or will be adjusted to the target position.

It is ideal that the insertion height position of the insertion member 53 is adjusted to the target position in the entire circumference of the peripheral portion We. In this case, however, there is a concern that the control in the edge trimming may become complicated, and a burden on the devices may be increased. Thus, in the division region R where the non-uniformity of the target position with respect to the threshold value is large, the insertion height position of the insertion member 53 is adjusted, whereas in the division region R where the non-uniformity of the target position is small, the insertion height position of the insertion member 53 is fixed. Thus, as compared to the case where the insertion height position is adjusted in the entire circumference, the movement of the insertion member 53 in the height direction can be reduced, so that the control in the edge trimming can be eased, and the burden on the devices can be reduced.

Meanwhile, as compared to the case where the insertion height position is fixed in the entire circumference, the fixed height position of the insertion member 53 can be calculated based on the average value, the median value, the maximum value, or the minimum value of the height position information in a narrower range (closer range). Accordingly, as compared to the case where the height position information in the entire circumference is referred to, non-uniformity between the insertion height position of the insertion member 53 and the target position can be suppressed, so that stable edge trimming can be carried out.

Moreover, in the above-described exemplary embodiment, based on the height position of the combined wafer T detected by the height detecting mechanism 57 and the previously acquired height position of the insertion member 53, the relative height position of the insertion member 53 with respect to the combined wafer T in the edge trimming is adjusted by the elevating mechanism 55. However, the position adjustment of the insertion member 53 is not limited to being performed in the height direction, and the position of the insertion member 53 may be further adjusted in the horizontal direction (in an insertion depth direction of the insertion member 53 with respect to the combined wafer T) by the horizontally moving mechanism 54 during the edge trimming.

The combined wafer T to be edge-trimmed may be held by the chuck 51 such that the combined wafer T itself or the center of the annularly formed peripheral modification layer M1 is deviated from the rotation center of the chuck 51. Further, in the combined wafer T to be edge-trimmed, it is also assumed that the above-described peripheral modification layer M1 is formed eccentrically with respect to the first wafer W1 under various conditions. In such a case, even if the height position of the insertion member 53 with respect to the combined wafer T is appropriately controlled, the position of the insertion member 53 in the horizontal direction with respect to the formation position of the peripheral modification layer M1 may be varied when the chuck 51 (combined wafer T) is rotated during the edge trimming, raising a risk that the peripheral portion We cannot be properly removed. Therefore, in the present exemplary embodiment, the position of the insertion member 53 in the horizontal direction is controlled by the horizontally moving mechanism 54 to follow this eccentricity of the peripheral modification layer M1.

Figure 12:
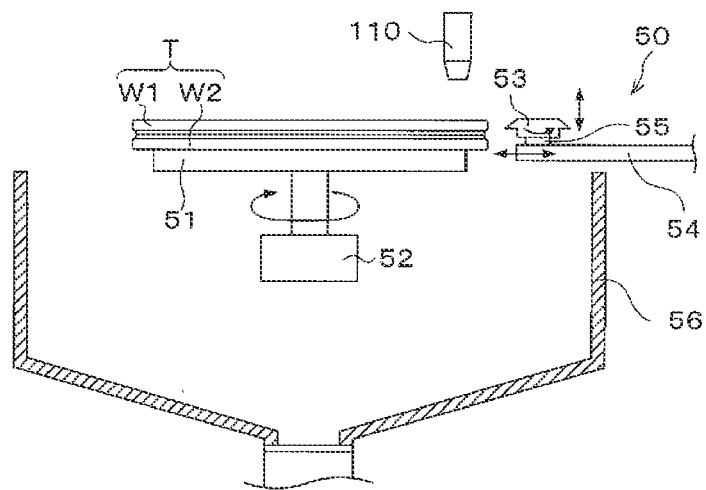
FIG. 12 is a side view schematically illustrating yet another configuration of the periphery removing apparatus according to the exemplary embodiment.

To elaborate, as depicted in FIG. 12, an eccentricity detecting mechanism 110 configured to detect an outer periphery position of the combined wafer T (first wafer W1) held by the chuck 51 or the amount of eccentricity of the peripheral modification layer M1 formed inside the combined wafer T may be further provided above the chuck 51. In addition, the eccentricity detecting mechanism 110 may be configured to be capable of detecting the positions of the combined wafer T and the insertion member 53 in the horizontal direction in addition to the outer periphery position of the combined wafer T or the amount of eccentricity of the peripheral modification layer M1 inside the first wafer W1. That is, the eccentricity detecting mechanism 110 may serve as a "horizontal detecting mechanism" according to the technique of the present disclosure. As the eccentricity detecting mechanism 110, a non-contact type laser displacement meter, a CCD camera, an IR camera, or the like may be used, for example. The eccentricity detecting mechanism 110 detects the outer periphery position of the combined wafer T (first wafer W1) or the amount of eccentricity of the peripheral modification layer M1 formed inside the first wafer W1 by detecting an end position of the combined wafer T (the first wafer W1 and the second wafer W2) along the entire circumference thereof or by detecting the formation position of the peripheral modification layer M1 (a distance from the end position to the peripheral modification layer M1). The detected outer periphery position or the amount of eccentricity is outputted to the control device 100. In the periphery removing apparatus 50, the relative position of the insertion member 53 in the horizontal direction (insertion depth) with respect to the combined wafer T is adjusted based on the detected outer periphery position or the amount of eccentricity of the peripheral modification layer M1, and a previously obtained position of the insertion member 53 in the horizontal direction enabling the separating of the peripheral portion We. Specifically, when only the detected outer periphery position of the combined wafer T (first wafer W1), that is, the eccentricity of the center of the combined wafer T (first wafer W1) held on the chuck 51 with respect to the rotation center of the chuck 51 is concerned, the insertion depth of the insertion member 53 with respect to a target depth can be controlled according to the outer periphery position of the combined wafer T (first wafer W1). Further, when the formation position of the peripheral modification layer M1 is eccentric with respect to the center of the combined wafer T, the insertion depth of the insertion member 53 with respect to the target depth is controlled according to the amount of eccentricity of the formation position.

In addition, the aforementioned "insertion depth" refers to a distance between an outer end of the combined wafer T (first wafer W1) and the insertion member 53 when the insertion member 53 is inserted into the combined wafer T. Further, the aforementioned "target depth" implies the insertion depth of the insertion member 53 enabling the separating of the peripheral portion We from the first wafer W1.

Further, for example, when the amount of eccentricity of the peripheral modification layer M1 detected by the eccentricity detecting mechanism 110 is stable over the entire circumference, or, even if not stable, when the non-uniformity falls within an allowable threshold value, the insertion depth of the insertion member 53 may be fixed. Further, the non-uniformity of the amount of eccentricity with respect to the threshold value may be calculated based on, for example, the outer periphery position of the combined wafer T (first wafer W1) detected by the eccentricity detecting mechanism 110, or the formation position of the peripheral modification layer M1, that is, the average value, the median value, the maximum value, or the minimum value of the distance from the end position of the combined wafer T. By fixing the insertion depth of the insertion member 53 in the edge trimming in this way, the control in the edge trimming is eased, and the burden on the devices can be reduced.

At this time, the insertion depth of the insertion member 53 with respect to the combined wafer T may be decided for each division region R of the peripheral portion We. In addition, non-uniformity of the amount of eccentricity with respect to the threshold value based on the average value, median value, maximum value or the minimum value of the formation position of the peripheral modification layer M1, that is, the distance from the end position of the combined wafer T or the outer periphery position of the combined wafer T (first wafer W1) is calculated for each division region R of the peripheral portion We, and, then, it may be determined whether the insertion depth of the insertion member 53 is to be fixed or adjusted to the target position.

In this way, by deciding the insertion depth of the insertion member 53 for each division region R of the peripheral portion We, the control in the edge trimming can be eased and the burden on the devices can be reduced, the same as in the case where the insertion height position of the insertion member 53 is decided for each division region R of the peripheral portion We. Moreover, non-uniformity between the target depth and the insertion depth of the insertion member 53 can be suppressed, so that stable edge trimming can be carried out.

Furthermore, the periphery removing apparatus may be further equipped with a pressing member (not shown) configured to correct bending of the combined wafer T at least in the edge trimming of the first wafer W1. In the above-described exemplary embodiment, non-uniformity of the target position caused by the bending or in-surface thickness of the combined wafer T is calculated by detecting the height position along the entire circumference of the combined wafer T, and the height position of the insertion member 53 is adjusted based on the calculated non-uniformity. However, by eliminating the bending of the combined wafer T by the pressing member during the edge trimming in this way, the non-uniformity of the target position, that is, the adjustment amount of the height position of the insertion member 53 can be reduced. That is, it is possible to more appropriately remove the peripheral portion We from the first wafer W1.

In addition, in the periphery removing apparatus, in order to improve the tact according to the removal of the peripheral portion We, the process is performed while continuously rotating the combined wafer T held by the chuck 51. In this case, an impact on the insertion member 53 inserted into the combined wafer T is big, raising a likelihood that it may become a cause of damage to the insertion member 53 or a life span decrease thereof. The impact to the insertion member 53 can be made small by setting the end of the insertion member 53 to have an acute angle, for example. In this case, the insertion member 53 may be damaged even with a small impact, resulting in a decrease of the life span thereof. Meanwhile, when the end of the insertion member 53 is made to have an obtuse angle, the damage of the insertion member 53 may be suppressed, but a pressing load required to push up the peripheral portion We increases, which may increase the risk of deterioration of the quality of the edge trimming and the risk of breakage of the combined wafer T.

Therefore, in order to properly insert the inserting member 53 into the combined wafer T and suppress the damage of the inserting member 53, a groove as a starting point of the separating may be formed at a preset position between the first wafer W1 and the second wafer W2, which is the target position, prior to the insertion of the insertion member 53.

Figure 13:
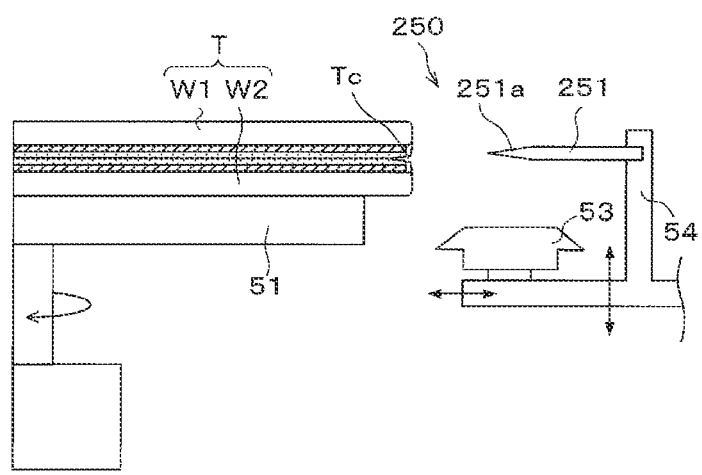
FIG. 13 is a side view schematically illustrating still yet another configuration of the periphery removing apparatus according to the exemplary embodiment.

To elaborate, as shown in FIG. 13, a periphery removing apparatus 250 according to a third exemplary embodiment is equipped with a starting point forming member 251 configured to form a groove Tc to be used as a starting point of separating with respect to the target position. Although the configuration of the starting point forming member 251 is not particularly limited, it has a blade portion 251a of a rectangular plate shape at a leading end, for example. Further, the starting point forming member 251 is configured to be moved by the horizontally moving mechanism 54 in a forward/backward direction with respect to the combined wafer T held by the chuck 51, and is also configured such that its relative height position with respect to the combined wafer T is adjustable by the elevating mechanism 55. Further, the starting point forming member 251 may be configured to be movable as one body with the insertion member 53, or may be configured to be movable independently of the insertion member 53.

In edge trimming in the periphery removing apparatus 250, the blade portion 251a of the starting point forming member 251 is inserted into the target position to form the groove Tc, prior to the insertion of the insertion member 53 to the target position. Further, the number of the groove Tc in the circumferential direction of the combined wafer T can be selected as required. The groove Tc may be formed at only one position in the circumferential direction, or may be formed at multiple positions. Moreover, the groove Tc may be formed at the entire circumference of the combined wafer T. However, when the combined wafer T is rotated in the state that the starting point forming member 251 is inserted to the target position, an impact may be applied to the blade portion 251a, raising a risk that a damage thereof may occur, as described above. For this reason, when forming the groove Tc at the entire circumference of the combined wafer T, it is desirable to repeat insertion and retraction of the starting point forming member 251.

In the present exemplary embodiment, the insertion member 53 is inserted into the groove Tc formed at the target position as described above. At this time, since the peripheral portion We is separated starting from the groove Tc formed at the target position, the separating of the peripheral portion We can be performed easily. Further, by forming the groove Tc in this way, it is possible to reduce a pressing load for the insertion of the insertion member 53, so that the risk of deterioration of the quality of the edge trimming and the risk of breakage of the combined wafer T can be reduced. Furthermore, the risk of damage to the insertion member 53 and a decrease in the life span thereof can be reduced.

In addition, in order to further facilitate the insertion of the insertion member 53 into the groove Tc, the groove Tc being formed may be widened in the thickness direction of the combined wafer T. Specifically, by rocking the starting point forming member 251 in an up-and-down direction by the elevating mechanism 55 when inserting the blade portion 251a into the target position, the groove Tc being formed can be enlarged.

Further, in case of providing the starting point forming member 251 in the periphery removing apparatus 250 in this way, it is desirable that the height detecting mechanism 57 is configured to further perform height alignment of this starting point forming member 251. In other words, it is desirable to adopt a configuration in which the starting point forming member 251 can be moved to below the height detecting mechanism 57 by the horizontally moving mechanism 54 and the elevating mechanism 55, for example. As another example, the height detecting mechanism 57 may be configured to be moved to above the starting point forming member 251.

Moreover, in case of providing the starting point forming member 251 in the periphery removing apparatus 250 in this way, presence or absence of a damage of the starting point forming member 251 and a position of the damage may be further inspected by using the member inspecting mechanism (not shown) in parallel with the above-described process inspection.

Figure 14A:
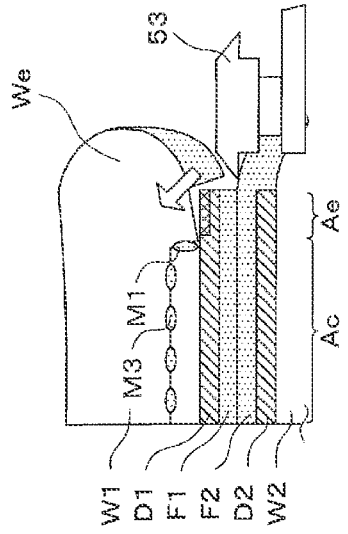
FIG. 14A to FIG. 14C are explanatory diagrams illustrating another application example of the technique according to the present disclosure.
Figure 14B:
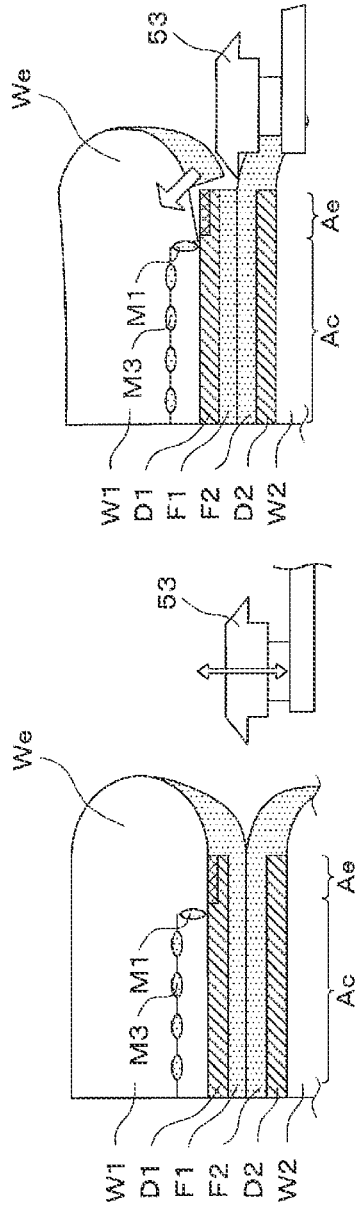
Figure 14C:
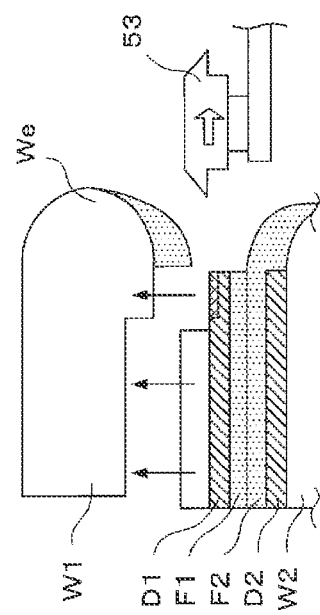

Additionally, the above exemplary embodiment has been described for the case of removing the peripheral portion We of the first wafer W1 in the combined wafer T in which the first wafer W1 and the second wafer W2 are bonded. However, the technique according to the present disclosure may be applicable even when thinning the first wafer W1 by peeling the front surface W1a side from the rear surface W1b side. Specifically, as depicted in FIG. 14A to FIG. 14C, in case that the peripheral modification layer M1 serving as a starting point of separating of the peripheral portion We of the first wafer W1 and an internal modification layer M3 serving as a starting point of the peeling are formed inside the first wafer W1, the height position of the insertion member 53 with respect to the height position between the first wafer W1 and the second wafer W2, which is the target position to which the insertion member 53 is to be inserted, can be appropriately adjusted when removing the peripheral portion We of the first wafer 1 from the second wafer W2 (combined wafer T) as one body with the rear surface W1b side of the first wafer W1.

Figure 15A:
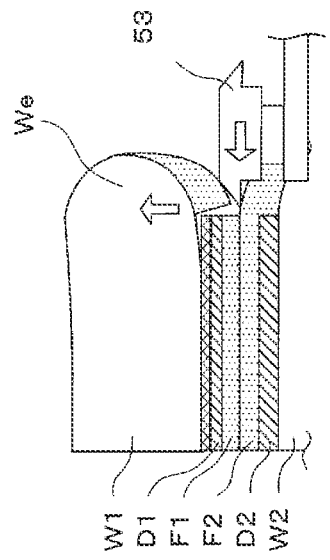
FIG. 15A to FIG. 15C are explanatory diagrams illustrating another application example of the technique according to the present disclosure
Figure 15B:
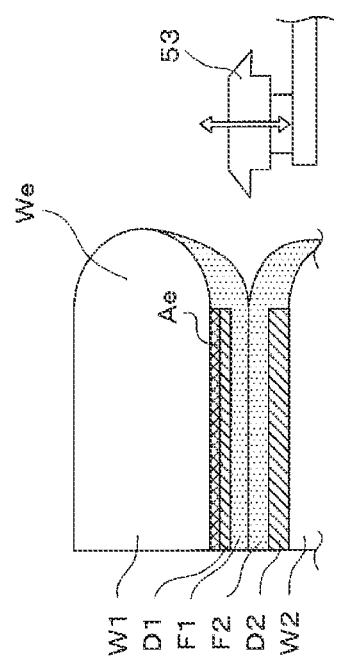
Figure 15C:
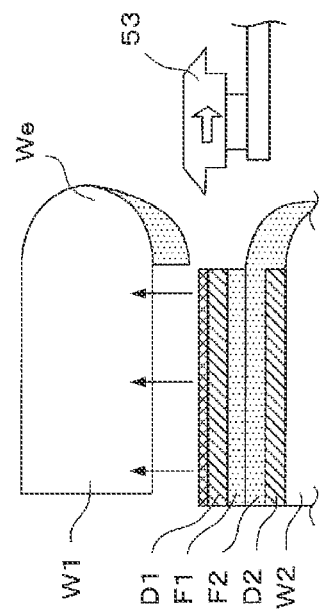

Also, the technique according to the present disclosure can also be applied to a process of removing the entire first wafer W1 from the second wafer W2 and transcribing the device layer D1 formed on the first wafer W1 to the second wafer W2, that is, a laser lift-off process of the combined wafer T. To be specific, as shown in FIG. 15A to FIG. 15C, in case that the non-bonding region Ae is formed on the entire surface of the first wafer W1 and the device layer D1 and the entire first wafer W1 is separated from the second wafer W2 (combined wafer T) starting from the non-bonding region Ae, the height position of the insertion member 53 with respect to the height position between first wafer W1 and the second wafer W2, which is the target position to which the insertion member 53 is to be inserted, can be appropriately adjusted.

In addition, in the above-described exemplary embodiment, the non-bonding region Ae is formed in the interface modifying apparatus 90 of the wafer processing system 1. However, the timing for the formation of the non-bonding region Ae is not limited thereto. By way of example, the non-bonding region Ae may be formed in the combined wafer T before the combined wafer T is carried into the wafer processing system 1 after it is formed. As another example, the non-bonding region Ae may be formed in the first wafer W1 at the outside of the wafer processing system 1 before the first wafer W1 is bonded to the second wafer W2.

Furthermore, the formation position of the non-bonding region Ae is not limited to the interface of the first wafer W1 and the device layer D1, either. By way of example, the non-bonding region Ae may formed at the surface film F1 or at the bonding interface between the first wafer W1 and the second wafer W2.

The exemplary embodiments disclosed herein are illustrative in all aspects and do not limit the present disclosure. The above-described exemplary embodiments may be omitted, replaced and modified in various ways without departing from the scope and the spirit of the appended claims.

According to the exemplary embodiments, it is possible to adjust the insertion position of the removing member with respect to the combined substrate in which the first substrate and the second substrate are bonded to each other.

We claim:

1. A substrate processing apparatus configured to process a combined substrate in which a first substrate and a second substrate are bonded to each other, the substrate processing apparatus comprising:
   a holding member configured to hold the combined substrate;
   a height detecting sensor configured to detect a height position of a peripheral portion of the combined substrate along an entire circumference of the combined substrate;
   a removing member configured to separate at least a peripheral portion of the first substrate from the second substrate by being inserted between the first substrate and the second substrate;
   a vertically movable base, on which the removing member is mounted, to adjust a relative height position of the removing member with respect to the holding member; and
   a controller configured to control an operation of the vertically movable base,
   wherein the controller controls the operation of the vertically movable base such that the relative height position of the removing member with respect to a target insertion position of the removing member is adjusted along the entire circumference of the combined substrate based on the detected height position by the height detecting sensor.

2. The substrate processing apparatus of claim 1, further comprising:
a horizontally movable base, on which the removing member is mounted, to move the removing member in a forward/backward direction with respect to the combined substrate,
wherein the vertically movable base adjusts the relative height position of the removing member with respect to the target insertion position by moving the removing member or the horizontally movable base up and down.

3. The substrate processing apparatus of claim 1, further comprising:
a modifying unit configured to form, inside the first substrate, a peripheral modification layer serving as a starting point of the separation of the peripheral portion and a split modification layer serving as a starting point of dividing the peripheral portion into multiple division regions.

4. The substrate processing apparatus of claim 1,
wherein, when inserting the removing member, the controller controls the operation of the vertically movable base such that a height position of the removing member is fixed at a height position calculated based on the height position of the combined substrate in the entire circumference thereof, the height position of the combined substrate being detected by the height detecting sensor.

5. The substrate processing apparatus of claim 1,
wherein, when inserting the removing member, the controller controls the operation of the vertically movable base such that a height position of the removing member is moved up and down, following the height position of the combined substrate in the entire circumference thereof, the height position of the combined substrate being detected by the height detecting sensor.

6. The substrate processing apparatus of claim 3,
wherein, when inserting the removing member, the controller controls the operation of the vertically movable base such that a height position of the removing member is fixed at a height position calculated based on the height position of the combined substrate for each of the multiple division regions, the height position of the combined substrate being detected by the height detecting sensor.

7. The substrate processing apparatus of claim 3,
wherein, when inserting the removing member, the controller controls the operation of the vertically movable base such that a height position of the removing member is moved up and down, following the height position of the combined substrate for each of the multiple division regions, the height position of the combined substrate being detected by the height detecting sensor.

8. The substrate processing apparatus of claim 6, further comprising:
a horizontal detecting mechanism configured to detect an outer periphery position of the first substrate or an eccentric amount of the peripheral modification layer formed inside the first substrate; and
a horizontally movable base, on which the removing member is mounted, configured to move the removing member in a forward/backward direction with respect to the combined substrate,
wherein, when inserting the removing member, the controller controls an operation of the horizontally movable base such that a position of the removing member in a horizontal direction is fixed at a depth position calculated based on the eccentric amount detected by the horizontal detecting sensor.

9. The substrate processing apparatus of claim 6, further comprising:
a horizontal detecting mechanism configured to detect an outer periphery position of the first substrate or an eccentric amount of the peripheral modification layer formed inside the first substrate; and
a horizontally movable base, on which the removing member is mounted, to move the removing member in a forward/backward direction with respect to the combined substrate,
wherein, when inserting the removing member, the controller controls an operation of the horizontally movable base such that a position of the removing member in a horizontal direction is moved in the horizontal direction, following the eccentric amount detected by the horizontal detecting sensor.

10. The substrate processing apparatus of claim 1,
wherein the vertically movable base comprises a guide member to move the removing member up and down according to a change in a height position of the combined substrate held by the holding member, and
the guide member comprises a contact member configured to travel in contact with a top surface of the combined substrate, and an arm member connecting the contact member and the removing member.

11. The substrate processing apparatus of claim 1, further comprising:
a separation inspecting mechanism configured to inspect the second substrate after removing the peripheral portion.

12. A substrate processing method of processing a combined substrate in which a first substrate and a second substrate are bonded to each other,
wherein a substrate processing apparatus configured to process the combined substrate comprises:
a holding member configured to hold the combined substrate;
a height detecting sensor configured to detect a height position of a peripheral portion of the combined substrate along an entire circumference of the combined substrate;
a removing member configured to be inserted between the first substrate and the second substrate; and
a vertically movable base, on which the removing member is mounted, to adjust a relative height position of the removing member with respect to the holding member, and
wherein the substrate processing method comprises:
detecting, by the height detecting sensor, a height position of the peripheral portion of the combined substrate along the entire circumference of the combined substrate;
adjusting, by the vertically movable base, a relative height position of the removing member with respect to a target insertion position of the removing member according to a position of the removing member with respect to the combined substrate in a circumferential direction along the entire circumference of the combined substrate based on the detected height position by the height detecting sensor; and
removing at least a peripheral portion of the first substrate by inserting the removing member into the target insertion position.

13. The substrate processing method of claim 12,
wherein the inserting of the removing member is performed by a horizontally movable base, on which the removing member is mounted, to move the removing member in a forward/backward direction with respect to the combined substrate, and
the adjusting of the relative height position of the removing member with respect to the target insertion position is carried out by moving the removing member or the horizontally movable base up and down.

14. The substrate processing method of claim 12, further comprising:
forming, inside the first substrate, a peripheral modification layer serving as a starting point of separating the peripheral portion and a split modification layer serving as a starting point of dividing the peripheral portion into multiple division regions.

15. The substrate processing method of claim 12,
wherein a height position to which the removing member is to be inserted is calculated based on the height position of the combined substrate in the entire circumference thereof, the height position of the combined substrate being detected by the height detecting sensor, and
in the removing of the peripheral portion of the first substrate, a height position of the inserted removing member is fixed.

16. The substrate processing method of claim 12,
wherein, in the removing of the peripheral portion of the first substrate, a height position of the removing member is moved up and down, following the height position of the combined substrate in an entire circumference thereof, the height position of the combined substrate being detected by the height detecting sensor.

17. The substrate processing method of claim 14, further comprising:
in the removing of the peripheral portion of the first substrate, a height position of the removing member is fixed at a height position calculated based on the height position of the combined substrate for each of the multiple division regions, the height position of the combined substrate being detected by the height detecting sensor.

18. The substrate processing method of claim 14, further comprising:
in the removing of the peripheral portion of the first substrate, a height position of the removing member is moved up and down, following the height position of the combined substrate for each of the multiple division regions, the height position of the combined substrate being detected by the height detecting sensor.

19. The substrate processing method of claim 17,
wherein the substrate processing apparatus comprises:
a horizontal detecting mechanism to detect an eccentric amount of the peripheral modification layer formed inside the first substrate; and
a horizontally movable base, on which the removing member is mounted, to move the removing member in a forward/backward direction with respect to the combined substrate,
wherein, in the removing of the peripheral portion of the first substrate, a position of the removing member in a horizontal direction is fixed at a depth position calculated based on the eccentric amount detected by the horizontal detecting mechanism.

20. The substrate processing method of claim 17,
wherein the substrate processing apparatus comprises:
a horizontal detecting mechanism configured to detect an eccentric amount of the peripheral modification layer formed inside the first substrate; and
a horizontally movable base, on which the removing member is mounted, to move the removing member in a forward/backward direction with respect to the combined substrate,
wherein, in the removing of the peripheral portion of the first substrate, a position of the removing member in a horizontal direction is moved in the horizontal direction, following the eccentric amount detected by the horizontal detecting mechanism.

21. The substrate processing method of claim 12, further comprising:
inspecting the second substrate after the removing of the peripheral portion,
wherein, when it is determined based on a result of the inspecting of the second substrate that the removing of the peripheral portion has not been properly performed, a position in the circumferential direction at which the peripheral portion is not properly removed is detected, and
the removing of the peripheral portion is performed again based on the detected position in the circumferential direction.

22. The substrate processing apparatus of claim 1,
wherein the removing member comprises an insertion member having a shape with a pointed end, and is configured to be rotatable around a vertical axis.

23. The substrate processing apparatus of claim 1,
wherein the removing member is configured to separate only a peripheral portion of the first substrate from that of the second substrate.

* * * * *